(12) United States Patent
Chen et al.

(10) Patent No.: US 8,030,185 B2
(45) Date of Patent: Oct. 4, 2011

(54) METHOD OF FABRICATING NANO-HETERO STRUCTURE

(75) Inventors: Chun-Yi Chen, Hualien County (TW); Yung-Jung Hsu, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 162 days.

(21) Appl. No.: 12/432,757

(22) Filed: Apr. 30, 2009

(65) Prior Publication Data

US 2010/0163841 A1 Jul. 1, 2010

(30) Foreign Application Priority Data

Dec. 31, 2008 (TW) .............................. 97151899 A

(51) Int. Cl.
*H01L 29/06* (2006.01)
(52) U.S. Cl. ........................... 438/478; 257/14; 977/762
(58) Field of Classification Search .................... 257/14; 438/478; 977/762
See application file for complete search history.

(56) References Cited

U.S. PATENT DOCUMENTS

| | | | |
|---|---|---|---|
| 4,602,988 A | 7/1986 | Kolts | |
| 4,889,604 A | 12/1989 | Khan et al. | |
| 6,300,274 B1 | 10/2001 | Park et al. | |
| 6,361,660 B1 | 3/2002 | Goldstein | |
| 6,447,650 B1 | 9/2002 | Park et al. | |
| 6,517,806 B2 | 2/2003 | Park et al. | |
| 6,878,666 B2 | 4/2005 | Domen et al. | |
| 7,015,171 B2 | 3/2006 | Domen et al. | |
| 7,169,733 B2 | 1/2007 | Wang et al. | |
| 7,220,391 B1 | 5/2007 | Huang et al. | |
| 2002/0045714 A1* | 4/2002 | Tomalia et al. | ............... 525/419 |
| 2009/0029258 A1* | 1/2009 | Seo et al. | ................. 429/231.95 |

FOREIGN PATENT DOCUMENTS

| | | |
|---|---|---|
| TW | I229011 | 3/2005 |
| TW | I264326 | 10/2006 |
| TW | I296541 | 5/2008 |

* cited by examiner

*Primary Examiner* — Jami M Valentine
(74) *Attorney, Agent, or Firm* — Jianq Chyun IP Office

(57) ABSTRACT

A nano-hetero structure is provided. The nano-hetero structure includes at least one nano-semiconductor base and a plurality of metal nanoparticles attached on the surface of nano-semiconductor base.

6 Claims, 3 Drawing Sheets

METHOD OF FABRICATING NANO-HETERO STRUCTURE

CROSS-REFERENCE TO RELATED APPLICATION

This application claims the priority benefit of Taiwan application serial no. 97151899, filed on Dec. 31, 2008. The entirety of the above-mentioned patent application is hereby incorporated by reference herein and made a part of specification.

BACKGROUND OF THE INVENTION

1. Field of the Invention

The present invention relates to a nano-structure and a fabricating method thereof and particularly to a nano-hetero structure for energy conversion and a fabricating method thereof.

2. Description of Related Art

A problem that the whole world faces in the $21^{st}$ century and to which a solution is urgently needed is the scarcer petrochemical energy sources. Therefore, seeking and developing renewable energy sources is an imperative issue. Solar energy is an inexhaustible energy source. A focus of modern energy technical development lies in how to convert solar energy to a form conveniently utilized in people's daily lives. For example, if solar radiation can be used to release hydrogen ions from water so as to generate hydrogen (i.e. convert solar energy into hydrogen energy), an example solution with potential at solving current energy problem can be found. The technology of generating hydrogen has a long history. From conventional electrolysis of water, hydrogen generation by thermal power to hydrogen generation by pyrolysis with petrochemical fuel etc., these technologies all have difficulty becoming popular due to high costs and environmental protection concerns. If solar energy can be used to directly decompose water to generate hydrogen, this technology has significant development potential in consideration of simplified processes, environmental protection, and costs.

SUMMARY OF THE INVENTION

The present invention provides a metal/semiconductor nano-hetero structure for absorbing solar energy and converting light energy into chemical energy, hydrogen energy, or electrical energy.

The present invention provides a method of fabricating a metal/semiconductor nano-hetero structure for effectively increasing a carrier separation efficiency of a composite structure.

The present invention provides a nano-hetero structure including at least one nano-semiconductor base and a plurality of metal nanoparticles attached to the nano-semiconductor base.

The present invention further provides a method of fabricating a nano-hetero structure including fabricating at least one nano-semiconductor base and then adding a metal ion solution to a solvent containing the nano-semiconductor base such that the metal ions are reduced to grow metal nanoparticles that attach to the surface of the nano-semiconductor base to form the nano-hetero structure.

In the present invention, the metal nanoparticles are attached to the surface of the nano-semiconductor base to form the metal/semiconductor nano-hetero structure. The nano-hetero structure can be used to absorb solar energy and convert light energy into chemical energy, hydrogen energy, or electrical energy.

In the method of fabricating the metal/semiconductor nano-hetero structure of the present invention, metal particles are directly attached to the surface of the semiconductor by chemical bonding, which can effectively increase the charge separation efficiency of the composite structure and decrease metal usage and cost.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
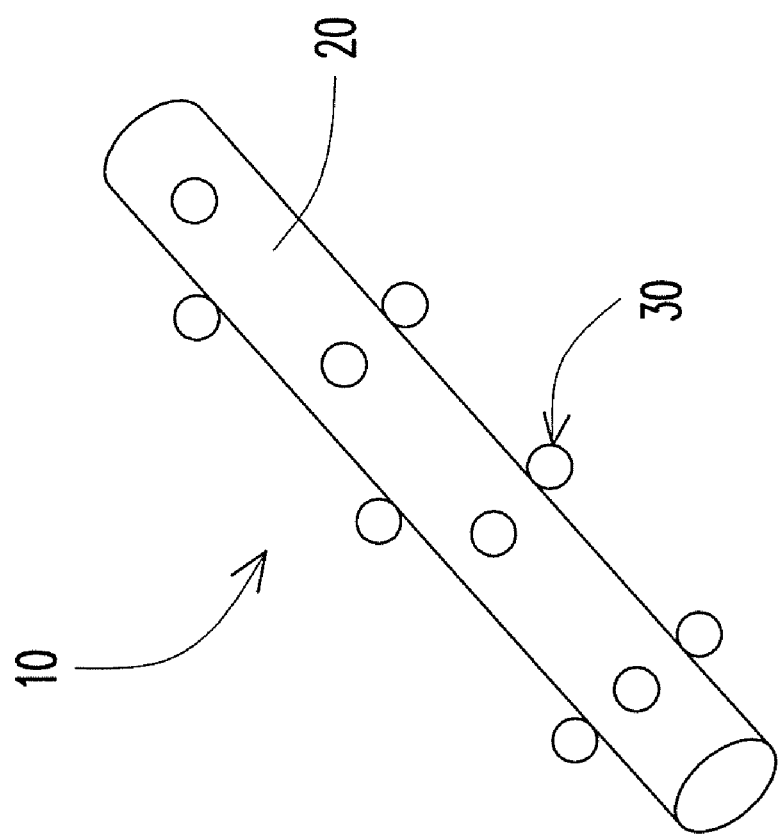
FIG. 1 is a schematic view of a nano-hetero structure according to one embodiment of the present invention.

FIG. 1 is a schematic view of a nano-hetero structure according to an embodiment of the present invention.

Referring to FIG. 1, a nano-hetero structure 10 of the embodiment of the present invention includes a nano-semiconductor base 20 and metal nanoparticles 30 attached to the surface of the nano-semiconductor base 20. After the material of the nano-semiconductor base 20 in the nano-hetero structure 10 is illuminated, pairs of electrons and holes are generated. The electrons, after being extracted and utilized, may contact with organic material in the environment, which triggers a series of oxidation and/or reduction processes to further decompose the organic material. This is the basic concept of photocatalytic reaction for a semiconductor photocatalyst. In addition, the extracted electrons may be applicable to water splitting that generating hydrogen or may be stored to meet energy demand. The material of the semiconductor is capable of absorbing light in the wavelength range of visible light. In practice, by the effect of the semiconductor material, solar energy is converted into a form usable by humans. In the present embodiment, a material of the nano-semiconductor base 20 includes semiconductor material capable of absorbing light in the wavelength range of visible light such as CdS, CdSe, ZnO, ZnS, ZnSe, ZnO—$RuO_2$, $CuGaS_2$, $TiO_2$, GaP, GaAs, or a combination thereof. A shape and number of the nano-semiconductor base 20 are not limited to as shown in FIG. 1 and can be a nanowire, nanowires array, nanotube, nanotubes array, nanoparticle, porous nanostructure, or a combination thereof. The nanowire is solid while the nanotube is hollow with an inner diameter smaller than an outer diameter by about 10~50 nm. In an embodiment, the diameter of the nanowire, a diameter of the nanoparticle, an outer diameter of the nanotube, or pore size of the porous nano-structure is about 20~110 nm. In another embodiment, the diameter of the nanowire, a diameter of the nanoparticle, an outer diameter of the nanotube, or pore size of the porous nanostructure is about 3~20 nm. In yet another embodiment, the diameter of the nanowire, a diameter of the nanoparticle, an outer diameter of the nanotube, or pore size of the porous nano-structure is about 10~30 nm. A length of the nano-semiconductor base 20 is, for example, about 5 nm~50 mm.

The metal nanoparticles 30 are attached to the nano-semiconductor base 20 by chemical bonding. A choice of types of the metal nanoparticles 30, control of sizes of the particles, and density of their attachment to the surface of the nanowire may effectively adjust catalytic capability of the composite structure. For example, in the case of photo-decomposition of water to generate hydrogen, by adjusting the above parameters, the rate of hydrogen generation can be controlled, lifetime of the catalyst can be effectively prolonged, and stability of hydrogen generation can be increased. In the present embodiment, a material of the metal nanoparticles 30 includes a material of which the Fermi level is slightly lower than the level of a conductive band of the nano-semiconductor base 20. The material of the metal nanoparticles 30 is, for example, Fe, Co, Ni, Cu, Ga, Mo, Ru, Rh, Pd, Ag, In, Sb, Ir, Pt, Au, Pb, or a combination thereof. A shape of the metal nanoparticles is not limited to as shown in FIG. 1 and may be granular, pillar, triconical, or porous. The size of the metal nanoparticles 30 is about 3~150 nm. The aforesaid size may refer to the diameter of the granular metal nanoparticle, the diameter of the cylindrical metal nanoparticle, or the maximum length of the sides of the triangular-conical metal nanoparticle.

Due to the difference between the relative energetic levels of metal and semiconductor, the metal/semiconductor nano-hetero structure 10 of the present invention exhibits a photo-inducted charge separation phenomenon. More specifically, because the Fermi Level of the metal in the metal nanoparticles 30 is slightly lower than the level of the conductive band of the nano-semiconductor base 20, after the semiconductor absorbing light, free electrons are excited onto the conductive band. The metal at the interface provides a level (a balanced Fermi level of the metal) which is more facile and advantageous to the electrons transfer. The level may act as an acceptor of the electrons to receive the free electrons from the conductive band of the semiconductor and thereby leads to the separation of electrons and holes. Moreover, the nano-semiconductor base 20 has a one-dimensional channel in structure, which is advantageous for the electrons to be transmitted therein after being excited and in association with the single-crystalline structure of the nano-semiconductor base 20, the probability of electrons trapping in semiconductor due to the structural defects is reduced. Therefore, through such design on the characteristics of the material and structure, the photo-inducted carrier separation efficiency of the composite structure is enhanced and effect thereof applied in the photo-catalytic reaction is increased. In addition, the metal nanoparticles 30 attached to the surface of the nano-semiconductor base 20 have the surface plasma resonance absorption effect. Therefore, the composite structure can absorb light more effectively. The light absorption capability of the overall material is increased so that the photo-catalysis capability is enhanced.

In the present invention, the metal nanoparticles are attached to the surface of the nano-semiconductor base to form the metal/semiconductor nano-hetero structure. The nano-hetero structure may be used to absorb solar energy and convert it into chemical energy, hydrogen energy, and electrical energy. In an application example, the metal/semiconductor nano-hetero structure may be a visible light-sensitive photo-catalyst which converts solar energy into chemical energy. With the enhanced photo-induced charge separation efficiency, the photogenerated electrons may be effectively extracted from the nano-hetero structure and utilized in the photo-catalysis reaction (e.g. photo-decomposition of organic waste, photocatalytic deodorization or photocatalytic sterilization). In another aspect, the chemical energy may be a hydrogen energy which is generated by the photocatalytic water splitting or by electro-chemical electrolysis of acid. In addition, the electrical energy may also be produced once the nano-hetero structure is integrated in a photo-current storage device or a solar cell.

The method of fabricating the nano-hetero structure is to prepare the nano-semiconductor base by solvothermal method first. Solvothermal method is to add a specific amine solvent as the capping agent in the liquid reaction system to generate the semiconductor nanowire product under high pressure and high temperature. The semiconductor nanowire product can be CdS, CdSe, ZnO, ZnS, ZnSe, $ZnO-RuO_2$, $CuGaS_2$, $TiO_2$, GaP, and GaAs. The solvent used in the solvothermal method is an amine solvent having a bidentate molecular structure such as ethylenediamine or diethylenetriamine. The nano-semiconductor base may be a nanowire, nanowires array, nanotube, nanotubes array, nanoparticle, porous nano-structure or a combination thereof. The diameter of the nanowire, the diameter of the nanoparticle, or the pore size of the porous nano-structure is about 20~110 nm. The outer diameter of the nanotube is about 20~110 nm and the inner diameter of the nanotube is smaller than the outer diameter by about 10~50 nm. The pore size, the inner diameter, and the outer diameter may be controlled by adjusting the temperature, solvent ratio, and reaction time.

Next, metal ion is added into the solvent in which the nano-semiconductor base has been formed so that the nano-semiconductor base contacts with the metal ion solution. By the effect of the amine solvent bound on the surface of the nano-semiconductor base, metal ion is reduced to form metal nanoparticles that are attached to the surface of the nano-semiconductor base. The metal ion includes ion of Fe, Co, Ni, Cu, Ga, Mo, Ru, Rh, Pd, Ag, In, Sb, Ir, Pt, Au, or Pb, or a combination thereof.

The nano-semiconductor base and the metal ion react by contact under a room temperature environment. In an embodiment, the grown metal nanoparticles may be granular, cylindrical, triangular-conical, or porous. The size of the metal nanoparticle is about 3~150 nm.

EXAMPLE

Cadmium nitrate and sulfur powder with a molar ratio of 1:1~1:2 are added into an ethylenediamine solvent of 40~80 ml. The temperature is then raised to 150° C.~200° C. to perform the reaction to produce the CdS nanowires. Then, a silver ion solution is added into the ethanol solution containing the CdS nanowires. The temperature is controlled at room temperature when the CdS nanowires react with the silver ion. By the effect of the ethylenediamine bound on the surface of CdS nanowires, the silver ion is reduced to form silver nanoparticles that are attached to the surface of the CdS nanowires.

Based on the result of transmission electron microscope, the silver nanoparticles are found to grow on the surface of the CdS nanowire.

Figure 2:
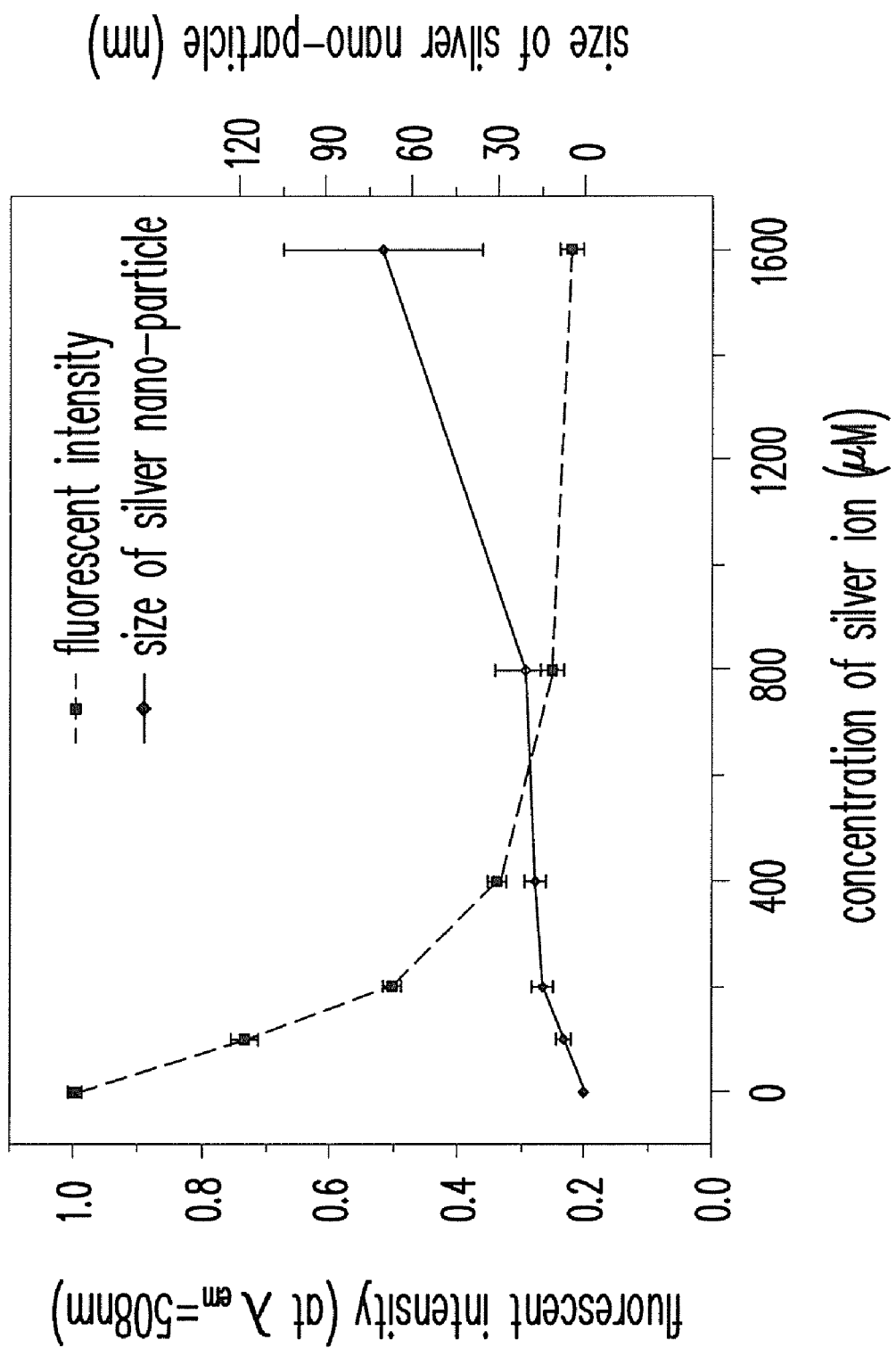
FIG. 2 illustrates relationships between the concentration of silver ions added in ethylenediamine solvent containing CdS nanowires, which is used to fabricate Ag—CdS nano-hetero structure, and the diameter of silver nanoparticles formed on CdS nanowire surface. It also depicts the dependence of silver ion concentration on the fluorescence intensity at 508 nm of the formed Ag—CdS nano-hetero structure.

FIG. 2 illustrates relationships between silver ion concentration and the diameter of silver nanoparticles formed on the CdS nanowires surface. It also depicts the dependence of silver ion concentration on the fluorescence intensity at 508 nm of the formed Ag—CdS nano-hetero structure. From the result in FIG. 2, the diameter of the silver nanoparticles increases when the silver concentration is increased. However, the fluorescent intensity is depressed when the silver concentration is increased.

Figure 3:
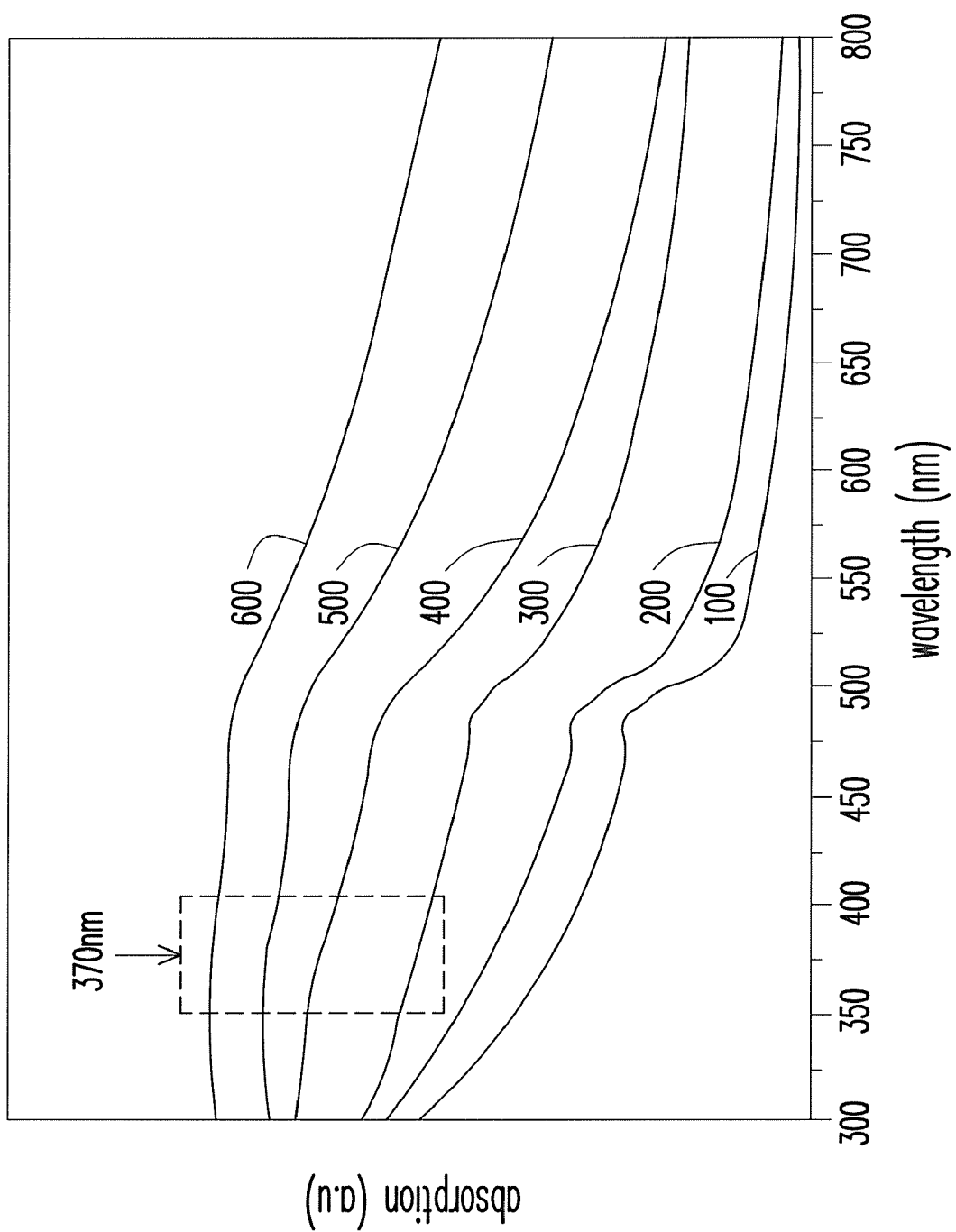
FIG. 3 illustrates the ultraviolet-visible absorption spectra of nano-hetero structures prepared with various concentrations of silver ion added in the nanowires-contained ethylenediamine solvent.

FIG. 3 illustrates the ultraviolet-visible absorption spectra of nano-hetero structures prepared with various concentrations of silver ion (0 μM, 100 μM, 200 μM, 400 μM, 800 μM, 1600 μM, represented by the curves of 100, 200, 300, 400, 500, 600, respectively). From the result of FIG. 3, the silver nanoparticles formed on the surface of the CdS nanowire are characteristic of ultraviolet absorption at 370 nm due to surface plasma resonance effect.

In summary, the nano-hetero structure of the present invention consists of the nano-semiconductor base capable of visible light absorption and photocatalytic activity, as well as the nanoparticles attached on the surface of the nano-semiconductor base. Practically, the nano-hetero structure of the present invention is applicable to convert solar energy into chemical energy, hydrogen energy, or electrical energy. A choice of types of the metal nanoparticle, control of sizes of the particles, and density of attachment thereof to the surface of the nanowires may effectively affect the photocatalytic capability of the composite structure. In addition, the structure characteristics may be designed in a nanowires array, which is advantageous for the assembly of the device. Structures of nanowires array may also solve the problems of poor dispersion and insufficient surface area, which is usually encountered in the conventional powder catalyst.

In the method of fabricating the metal/semiconductor nano-hetero structure of the present invention, metal particles are directly attached to the surface of the semiconductor by chemical bonding, which can effectively increase the charge separation efficiency of the composite structure and decrease metal usage and cost. In addition, the metal particles exposed in the photocatalytic reaction system are usually subject to chemical poisoning. By attaching the metal particles to the surface of the semiconductor, area of the metal particles being exposed to the reaction solution can be effectively decreased such that the extent of chemical poisoning can be diminished, the lifetime of the catalyst can be prolonged, and the long-term stability of the photo-catalysis can be maintained.

It will be apparent to those skilled in the art that various modifications and variations can be made to form the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of a nano-hetero structure, comprising:
   fabricating at least a nano-semiconductor base; and
   adding a metal ion solution into an amine solvent containing the nano-semiconductor base such that a plurality of metal nanoparticles are grown on a surface of nano-semiconductor base to form the nano-hetero structure.

2. The fabricating method of a nano-hetero structure according to claim 1, wherein a method of fabricating the nano-semiconductor base comprises a solvothermal synthetic method.

3. The fabricating method of a nano-hetero structure according to claim 2, wherein the solvothermal method uses the amine solvent as a capping agent.

4. The fabricating method of a nano-hetero structure according to claim 3, wherein the amine solvent comprises ethylenediamine or diethylenetriamine.

5. The fabricating method of a nano-hetero structure according to claim 1, wherein a material of the nano-semiconductor base comprises CdS, CdSe, ZnO, ZnS, ZnSe, ZnO—$RuO_2$, $CuGaS_2$, $TiO_2$, GaP, GaAs, or a combination thereof.

6. The fabricating method of a nano-hetero structure according to claim 1, wherein the metal ion solution comprises ion of Fe, Co, Ni, Cu, Ga, Mo, Ru, Rh, Pd, Ag, In, Sb, Ir, Pt, Au, or Pb, or a combination thereof.

* * * * *